United States Patent [19]
Oikawa et al.

[11] Patent Number: 5,483,071
[45] Date of Patent: Jan. 9, 1996

[54] TWO-DIMENSIONAL RADIATION DETECTOR

[75] Inventors: Shiro Oikawa, Shiga; Takayuki Takemoto, Kyoto; Tutomu Katou, Hatano; Shirou Suzuki, Yokosuka; Kenkichi Tanioka, Tama, all of Japan

[73] Assignees: Shimadzu Corp., Kyoto; Nippon Hoso Kyokai, Tokyo, both of Japan

[21] Appl. No.: 266,606

[22] Filed: Jun. 28, 1994

[30] Foreign Application Priority Data

Jun. 30, 1993 [JP] Japan .................................. 5-188755

[51] Int. Cl.$^6$ ..................... H01L 31/0264; G01T 1/202; G01T 1/24
[52] U.S. Cl. ................ 250/370.09; 250/370.11; 250/580
[58] Field of Search .................... 250/370.09, 370.11, 250/580

[56] References Cited

U.S. PATENT DOCUMENTS 5,182,624   1/1993   Tran et al. ................ 257/40

OTHER PUBLICATIONS

V. Perez–Mendez, G. Cho, I. Fujieda, S. N. Kaplan, S. Qureshi and R. A. Street, "The Application of Thick Hydrogenated Amorphous Silicon Layers to Charged Particle and X–Ray Detection." Lawrence Berkeley Laboratory LBL–26998 Presented at the Materials Research Society Conference, San Diego, Calif., Apr. 24–28, 1989.

*Primary Examiner*—Constantine Hannaher
*Attorney, Agent, or Firm*—Nikaido, Marmelstein, Murray & Oram

[57] ABSTRACT

A two-dimensional radiation detector for obtaining a radiographic image as converted into electric signals. The detector has a multi-layer structure including a scintillator, a translucent electrode film, a photoconductive film and a scan switch layer. The scan switch layer includes conductors arranged in matrix form and in contact with the photoconductive film, a plurality of FETs corresponding to the conductors arranged in matrix form, and a uniformly planar conductor for successively applying a bias voltage through the FETs to the matrix conductors row by row. Each FET has a drain electrode connected to one of the matrix conductors, a source electrode connected to the uniformly planar conductor, and a gate electrode connected to the drive circuit. The translucent electrode film includes column conductors corresponding to columns of the matrix conductors, each of the column conductors being connected to a signal reading line.

9 Claims, 9 Drawing Sheets

(PRIOR ART)
Fig. 1C
(col. j)

TWO-DIMENSIONAL RADIATION DETECTOR

BACKGROUND OF THE INVENTION (1) Field of the Invention

This invention relates to two-dimensional radiation detectors suited for use in radiographic and other diagnostic apparatus to detect radiation such as X rays, including two-dimensional positions of incidence thereof.

(2) Description of the Related Art

Various proposals have heretofore been made relating to two-dimensional radiation detectors of the solid-state scan type (see Japanese Patent publications (Unexamined) Nos. 1990-253185, 1991-185865, 1992-206573, 1992-212456 and 1992-212458, for example). To sum up these proposals, a conventional two-dimensional radiation detector may be said to have a construction as shown in FIGS. 1A–1E, 2 and 3.

Figure 1A:
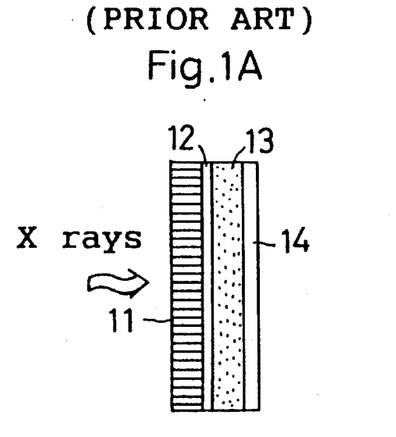
FIGS. 1A–1E are schematic views of a conventional two-dimensional radiation detector.
Figure 1B:
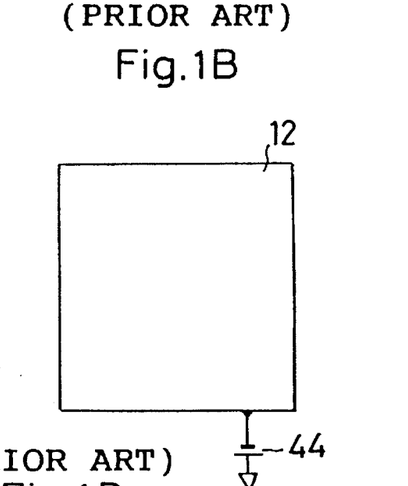
Figures 1C, 1D:
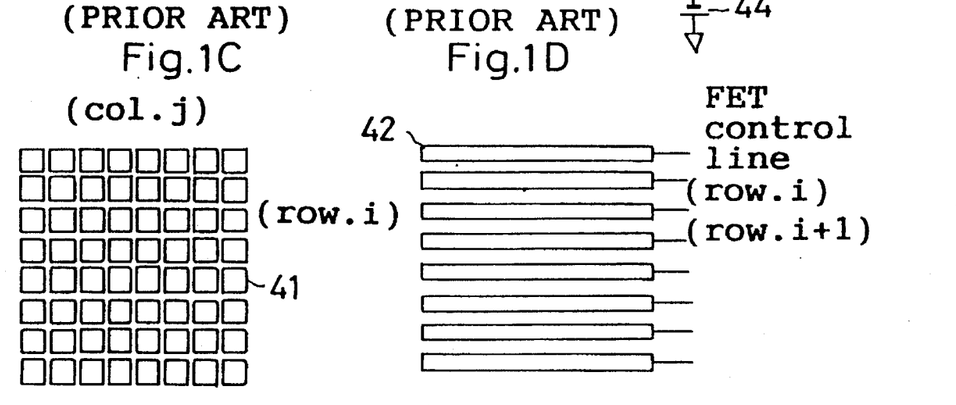
Figure 1E:
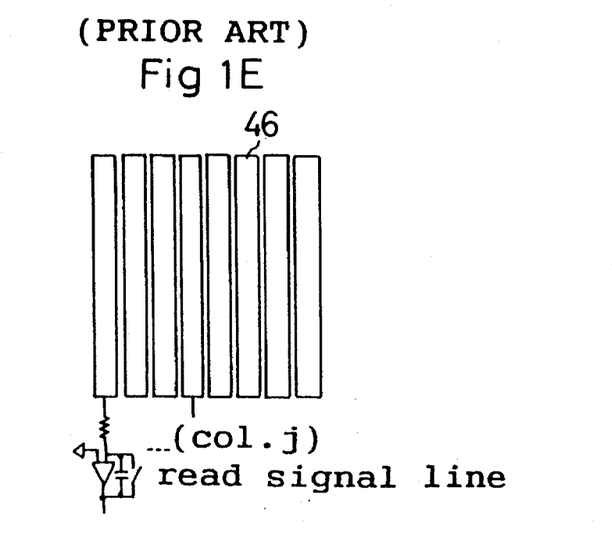
Figure 2:
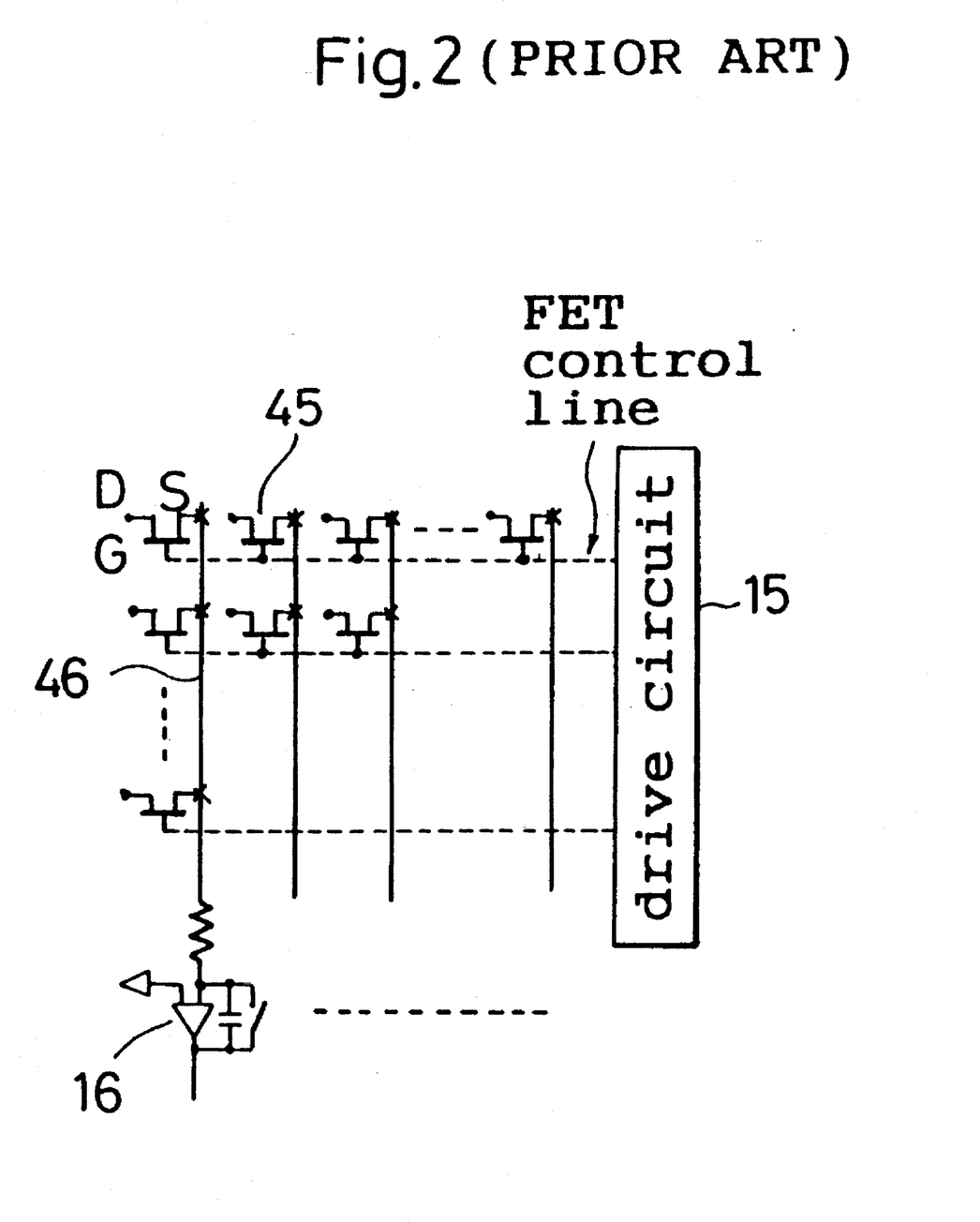
FIG. 2 is a schematic view of a connecting arrangement of FETs in the conventional detector.

Referring to FIG. 1A, the conventional detector has a multi-layer structure including a scintilator 11, a translucent electrode film 12, a photoconductive film 13 and a scan switch layer 14. As shown in FIG. 1B, the translucent electrode film 12 is in the form of a uniform plane throughout the entire area thereof. The scan switch layer 14 includes conductors 41 arranged in matrix form and in contact with the photoconductive film 13, row conductors 42 in strip patterns corresponding to the rows of conductors 41, column conductors 43 in strip patterns corresponding to the columns of conductors 41, and a multiplicity of switching elements (FETs) 45 each having the drain connected to one of the matrix conductors 41, the source connected to one of the column conductors 46 and the gate connected to one of the row conductors 42 (see FIGS. 1C, 1D, 1E, 2 and 3). The translucent electrode film 12 receives a predetermined potential from a bias source 44. The row conductors 42 of the scan switch layer 14 are connected to control lines of a drive circuit 15, respectively. The column conductors 46 are connected to signal reading circuits 16 of signal reading lines, respectively.

The scintilator 11 produces light when hit by X rays, and the light is led through the translucent electrode film 12 to the photoconductive film 13, whereby electric charges accumulate on the photoconductive film 13. That is, the scintilator 11 converts a radiographic image into an optical image, and the photoconductive film 13 converts this optical image into an electric charge image. The electric charges on the photoconductive film 13 are read pixel by pixel, each pixel corresponding to each matrix conductor 41, by actuating the FETs 45. Specifically, when the drive circuit 15 supplies a drive signal to one of the row conductors 42, all of the FETs 45 in that row (e.g. row "i") are turned on to cause charge storing currents corresponding to the respective pixels to be retrieved simultaneously from the matrix conductors 41 in row "i" and in the respective columns, through the respective column conductors 46.

In the conventional two-dimensional radiation detector described above, the column conductors 46 are directly connected to the electrodes (sources) of the switching elements (FETs). Consequently, switching noise of the switching elements is transmitted to the sources through stray capacitance between the gate and source to be superimposed on read signal currents, thereby lowering image quality.

SUMMARY OF THE INVENTION

This invention has been made having regard to the state of the art noted above, and its object is to provide an improved two-dimensional radiation detector which prohibits switching noise of switching elements from being superimposed on read signal currents, thereby to enhance image quality.

The above object is fulfilled, according to this invention, by a two-dimensional radiation detector for obtaining a radiographic image as converted into electric signals, the detector comprising:

a scintilator for converting the radiographic image into an optical image;

a photoconductive film for converting the optical image into an image based on electric charges;

a translucent electrode film and a scan switch layer formed on opposite surfaces of the photoconductive film; and a drive circuit connected to the scan switch layer;

wherein the scan switch layer includes:

a plurality of conductors arranged in matrix form and in contact with the photoconductive film;

a conductor to which a bias voltage is applied;

a plurality of switching elements interposed between the conductors arranged in matrix form and the conductor to which the bias voltage is applied; and row conductors for applying a drive signal from the drive circuits to the switching elements;

the translucent electrode film including column conductors corresponding to columns of the conductors arranged in matrix form, each of the column conductors being connected to a signal reading line.

According to this invention, the scintilator produces light when hit by X rays. An optical image thus produced by the scintilator is led through the translucent electrode film to the photoconductive film, whereby an electric charge image is stored on the photoconductive film. When the drive circuit turns on the switching elements in one row, a bias voltage is applied through the switching elements to the matrix conductors in one row. This bias voltage applies an electric field to the photoconductive film interposed between the matrix conductors in one row and the column conductors of the translucent electrode film. As a result, discharge currents from the electric charges stored in positions of the photoconductive film opposed to the matrix conductors in one row flow through the column conductors of the translucent electrode film to the signal reading lines. Thus, the photoconductive film is interposed between the switching elements and signal reading lines. Because of the distance between the switching elements and signal reading lines, and because the photoconductive film has a capacity, switching noise has a reduced chance of entering the signal reading lines. As a result, signal currents having an improved signal-to-noise ratio are attained to enhance image quality.

The scintilator is not limited to any particular type as long as it converts incident radiation into visible light. Where the incident radiation is X rays, the scintilator preferably comprises a needle crystal structure of sodium-doped cesium iodide (CsI:Na).

Further, it is preferred that the photoconductive film comprises an amorphous semiconductor layer having selenium (Se) as a main component thereof.

Preferably, the conductor to which the bias voltage is applied comprises a uniformly planar conductor covering the switching elements. This is effective to avoid influences of external noise.

The switching elements comprise field-effect transistors (FETs), for example, each FET having a drain electrode connected to one of the conductors arranged in matrix form, a source electrode connected along with source electrodes of the other FETs to the conductor to which the bias voltage is applied, and a gate electrode connected along with other FETs in the same row through one of the row conductors to the drive circuit. When the drive circuit applies a drive signal to the gate electrodes, the FETs in one row are turned on to apply the bias voltage to the matrix conductors in one row.

Where the bias voltage is a high voltage, the drive circuit preferably includes a ground section for generating a drive signal of low voltage level to turn on the switching elements row by row, a floating section for converting the drive signal into a drive signal of bias voltage level, and an isolator section for electrically separating the ground section and the floating section.

Further, the column conductors of the translucent electrode film may be divided to correspond to a plurality of rows of the conductors arranged in matrix form. Then, the column conductors have a reduced length to diminish the influences of noise accordingly.

The row conductors may be divided and arranged to extend perpendicular to the column conductors, the drive signal being applied simultaneously to a plurality of corresponding row conductors among the row conductors divided. This construction provides the advantage of decreasing the number of times the row conductors are switched per frame, thereby diminishing the frequency bandwidth per frame to improve the signal-to-noise ratio (S/N ratio).

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

A preferred embodiment of the present invention will be described in detail hereinafter with reference to the drawings.

Figure 4A:
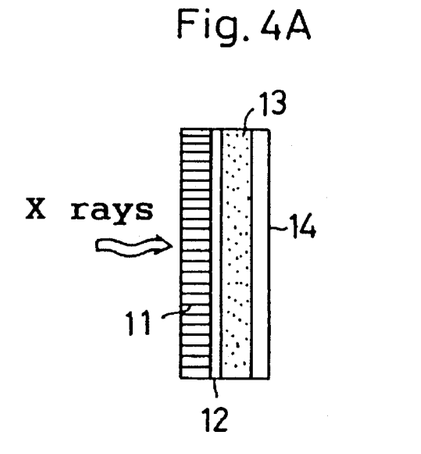
FIGS. 4A–4E are schematic views of a two-dimensional radiation detector embodying this invention.
Figure 4B:
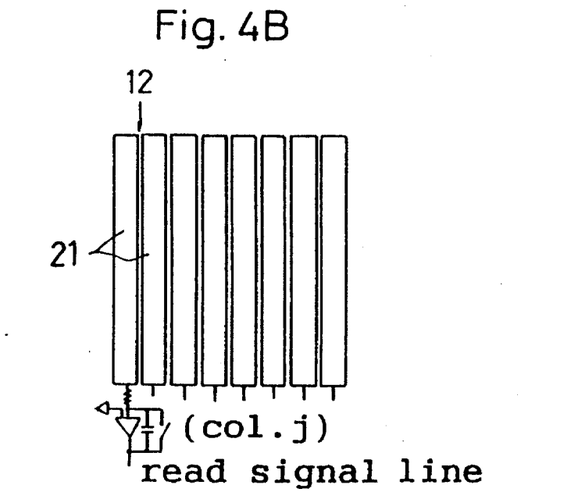

As shown in FIG. 4A, a two-dimensional radiation detector according to this invention has a multi-layer structure including a scintilator 11, a translucent electrode film 12, a photoconductive film 13 and a scan switch layer 14. As shown in FIG. 4B, the translucent electrode film 12 is formed of column conductors 21 in strip patterns of discrete columns. Each of the column conductors 21 is connected to a signal reading circuit 16 of a signal reading line (see FIG. 6 also).

The scintilator 11 is formed of a material responsive to X rays to produce visible rays, such as sodium-doped cesium iodide (CsI:Na), Zns or $CaWO_4$. A needle crystal structure of CsI:Na is particularly preferred from the viewpoint of X-ray conversion efficiency. A film thickness of CsI:Na normally is in the order of 200 to 400 αm.

The translucent electrode film 12 is formed of a translucent electroconductive film such as of ITO which is an alloy of indium, tin and oxygen, or $SnO_2$. The translucent electrode film 12 is formed as thin as possible (approximately 300Å) to avoid scattering of light.

The photoconductive film 13 is formed of an amorphous semiconductor layer (a-Se) having selenium (Se) as a main component, an amorphous semiconductor layer (a-Si) having silicon (Si) as a main component, or the like. Particularly, a-Se is preferred since a strong electric field applied thereto produces an avalanche effect inside to perform an excellent electron multiplying function. The photoconductive film 13 normally has a thickness in the order of 4 to 20 αm.

Figure 4C:
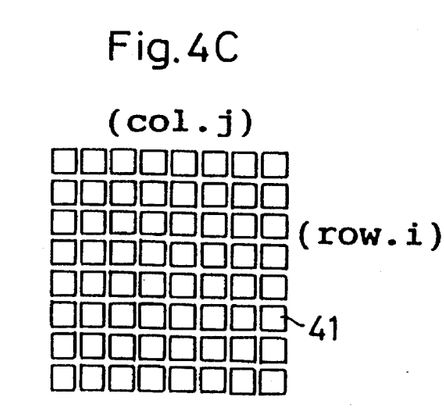
Figure 4D:
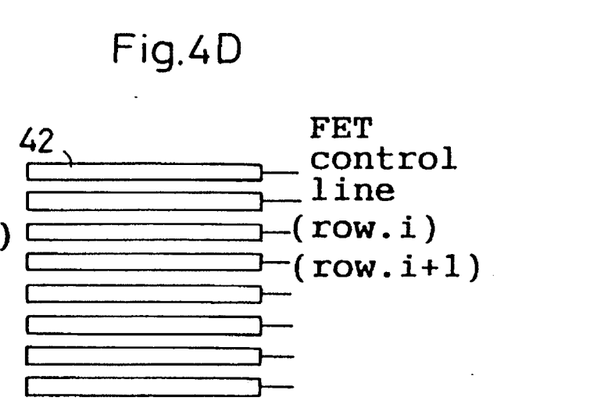
Figure 4E:
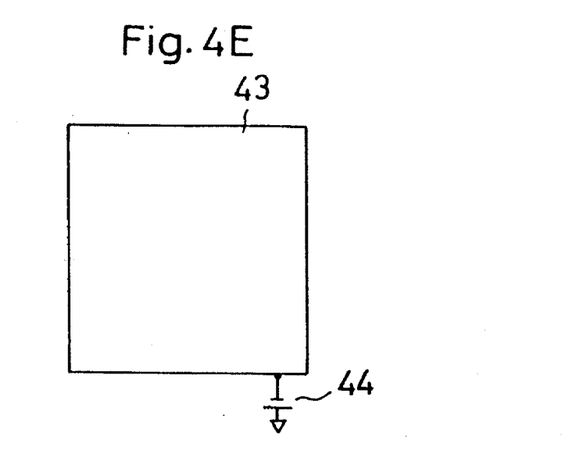
Figure 5:
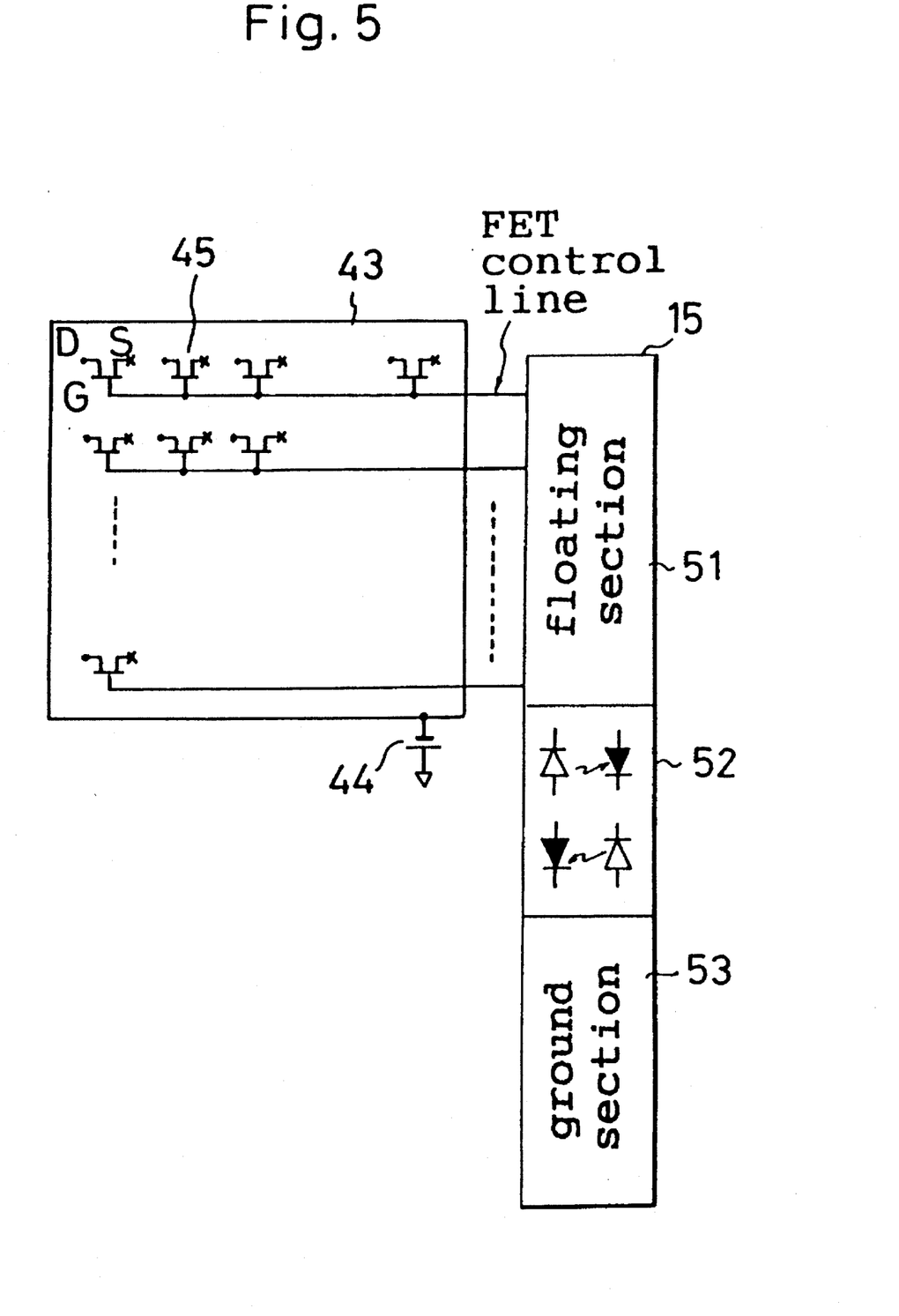
FIG. 5 is a schematic view of a connecting arrangement of FETs in the detector embodying this invention.

The scan switch layer 14 includes conductors 41 arranged in matrix form and in contact with the photoconductive film 13 (see FIG. 4C), row conductors 42 in strip patterns corresponding to the rows of conductors 41 (see FIG. 4D), and a multiplicity of FETs 45 acting as switching elements each having the drain connected to one of the matrix conductors 41 and the gate connected to one of the row conductors 42. A conductor 43 in the form of a uniform plane throughout the entire area thereof, as shown in FIG. 4E, is connected to the source of each FET 45 (see FIGS. 5 and 6 also). The uniformly planar conductor 43 receives a bias voltage from a bias source 44. Where the photoconductive film 13 is formed of a-Se, the bias voltage applies a strong electric field in the order of $10^8$V/m to the photoconductive film 13 because of the avalanche effect.

Figure 7:
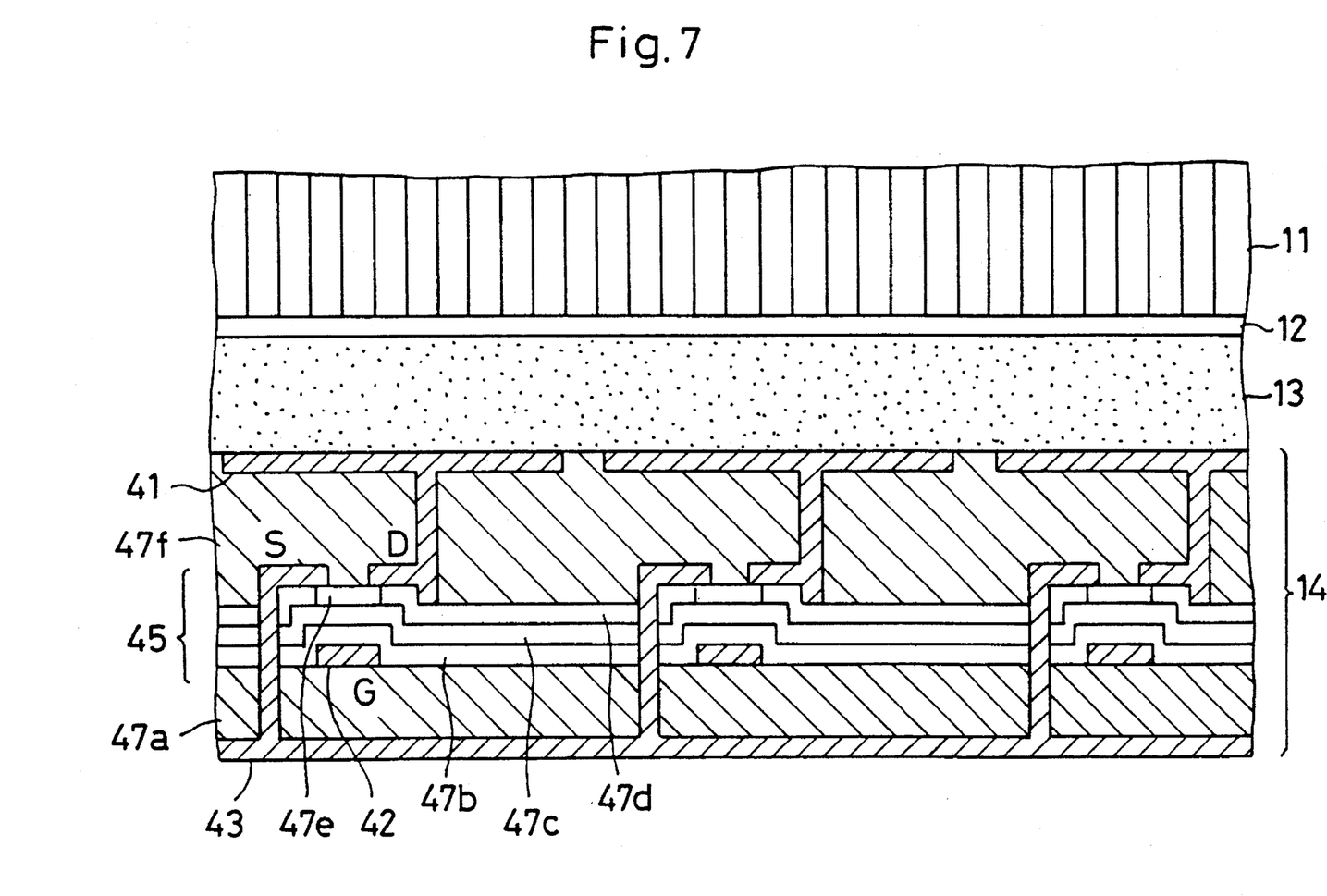
FIG. 7 is a schematic sectional view of the detector embodying this invention.

FIG. 7 schematically shows an element structure of the above two-dimensional radiation detector. This structure includes, in the order of arrangement from the bottom, the uniformly planar conductor 43, a polyimide resin layer 47a, gate electrodes G (row conductors 42), a silicon nitride layer 47b, an intrinsic a-Si:H layer 47c, an N-type layer 47d, a silicon nitride layer 47e, source electrodes S, drain electrodes D, a polyimide resin layer 47f, matrix conductors 41, photoconductive film 13, translucent electrode film 12 and scintilator 11.

The above element structure may be produced as follows, for example.

The scintilator 11 is formed by depositing CsI:Na by vacuum evaporation on a substrate (not shown) of an X-ray transmitting material such as aluminum or glass. On the other hand, the various elements of the scan switch layer 14 are laminated on an insulating substrate such as of glass (not shown), and then the photoconductive film 13 and translucent electrode film 12 are formed thereon. The scintilator 11 on the former substrate and the translucent electrode film 12 on the latter substrate are bonded together with polyimide resin, for example.

The row conductors 42 connected to the gate electrodes G of FETs 45 are connected to control lines of a drive circuit 15. The drive circuit 15 includes a floating section 51, an optical isolator section 52 and a ground section 53. The ground section 53 generates an FET scan signal having a low voltage close to ground level. The floating section 51 shifts the FET scan signal by a voltage corresponding to the bias voltage. The floating section 51 and control lines are separated from the ground section 53 by the optical isolator section 52. This is because a high bias voltage (e.g. 500 to 1000V) is applied to the source electrodes S of FETs 45 through the uniformly planar conductor 43, and it is therefore necessary to float the control lines from a ground. The construction for electrically isolating the control lines from the ground may employ, in place of the above optical isolator section 52, a capacitor for barring DC components or an inductance for effecting electromagnetic isolation.

When X rays impinge upon an incidence plane of the scintillator 11, a radiographic image is converted into an optical image which is in turn converted into an electric charge image by the photoconductive film 13. The electric charges on the photoconductive film 13 are read pixel by pixel, each pixel corresponding to each matrix conductor 41, by actuating the FETs 45. As seen from FIG. 6, read signal currents are taken out through the respective column conductors 21 of the translucent electrode film 12, and flow through protective resistors 61 to integrating capacitors 63 of charge sensitive preamplifiers 62. The signal currents are stored in the integrating capacitors 63, and outputted as voltage signals to analog-to-digital converters not shown. Integrating switches 64 are operable, after completion of an analog-to-digital conversion, to short-circuit the integrating capacitors 63 to cause discharge from the capacitors 63 to be ready for a next scan.

Figure 3:
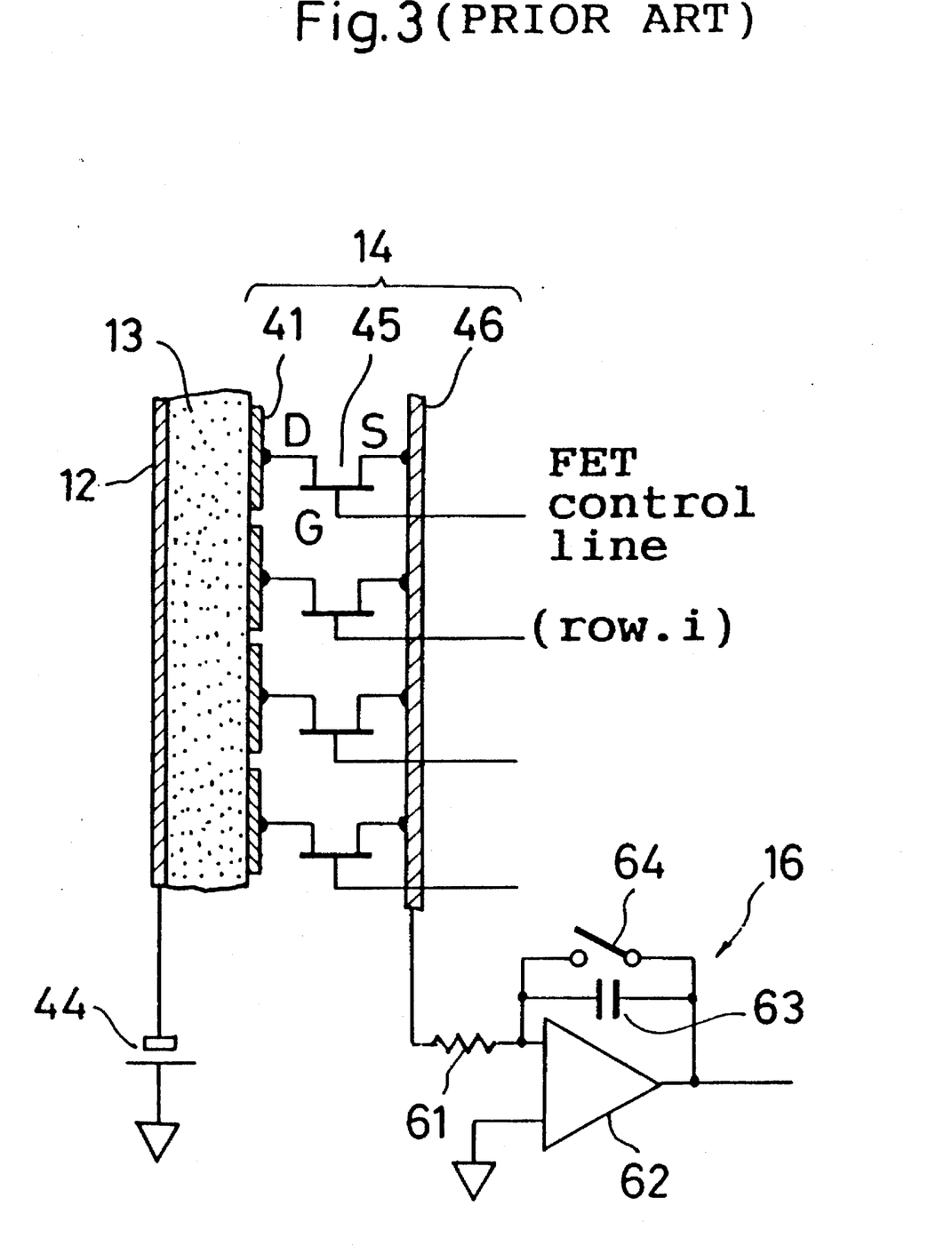
FIG. 3 is a schematic view of a connecting arrangement of the FETs and signal reading circuits in the conventional detector.
Figure 6:
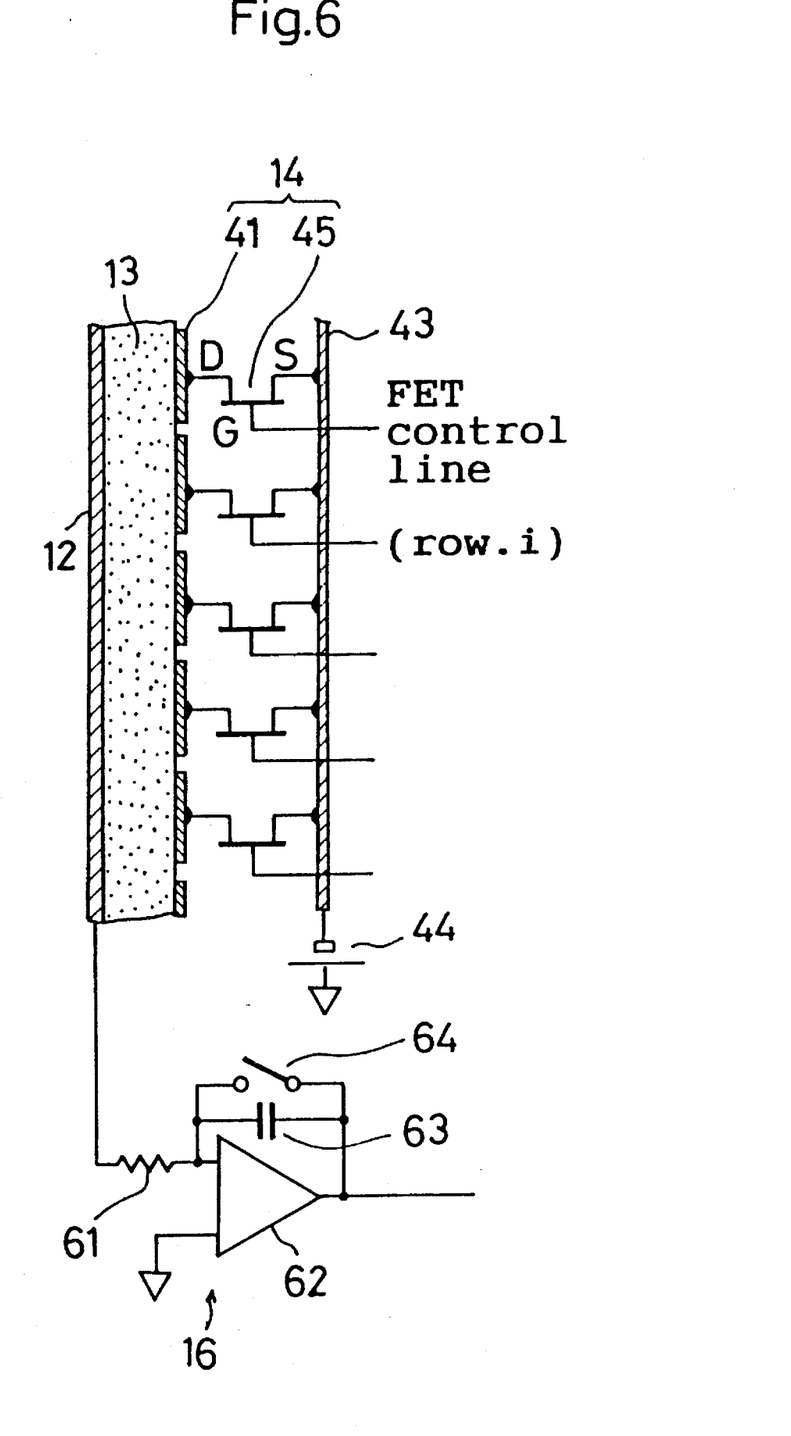
FIG. 6 is a schematic view of a connecting arrangement of the FETs and signal reading circuits in the detector embodying this invention.

Assume, for example, that a drive signal is applied to the control line for row "i" to actuate all the FETs 45 in row "i". Then, signals of pixels corresponding to the matrix conductors 41 in row "i" and arranged in the respective columns are read simultaneously. As is clear from a comparison between FIG. 6 illustrating this embodiment and FIG. 3 illustrating the prior art, each signal reading circuit 16 in this embodiment is connected to one of the column conductors 21 of the translucent electrode film 12 opposed to the scan switch layer 14 across the photoconductive film 13. Thus, the photoconductive film 13 is interposed between the signal reading circuits 16 and FETs 45. The capacitive effect of the photoconductive film 13 and the effect of the distance between the gate electrodes G of FETs 45 and the column conductors 21 of the translucent electrode film 12, in combination, restrain gate leak currents of FETs 45 and other switching noise from the scan switch layer 14 from entering the signal reading lines. As a result, the signal currents have an improved signal-to-noise ratio to provide high quality image signals. The capacitive effect mentioned above indicates that an equivalent circuit which, as shown in FIG. 6, transmits noise from the gate G to the signal reading circuit 16 comprises a series connection of $C_{GD}$ (stray capacitance between gate and drain) and $C_P$ (capacity of the photoconductive film 13 corresponding to one pixel). The composite capacity of a series connection is determined by the smaller capacity. Therefore, where $C_P$ is the smaller, the capacitive effect is prominent in this invention compared with the prior art. In addition, the uniformly planar conductor 43 acts as the conductor connected to the source electrodes S of FETs 45 of scan switch layer 14, which produces a shield effect to shut off external noise.

Figure 8A:
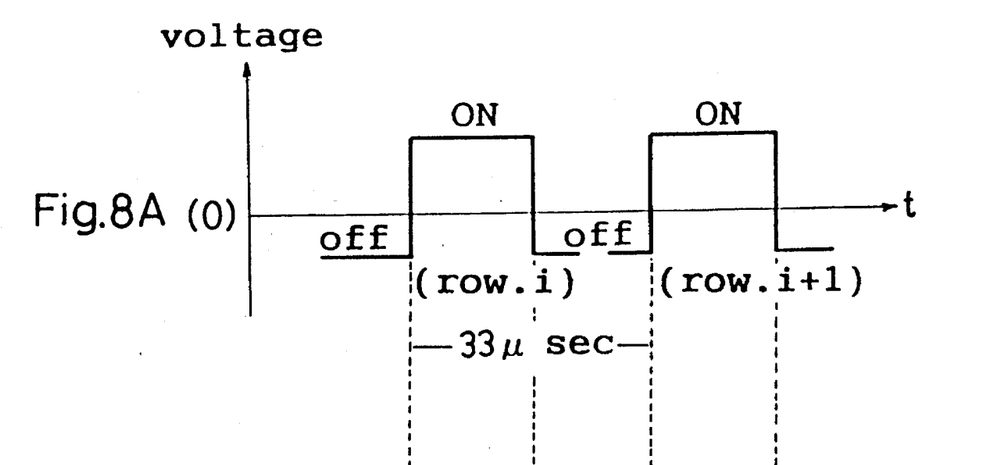
FIG. 8A through 8D are a time chart illustrating operation of the detector embodying this invention.
Figure 8B:
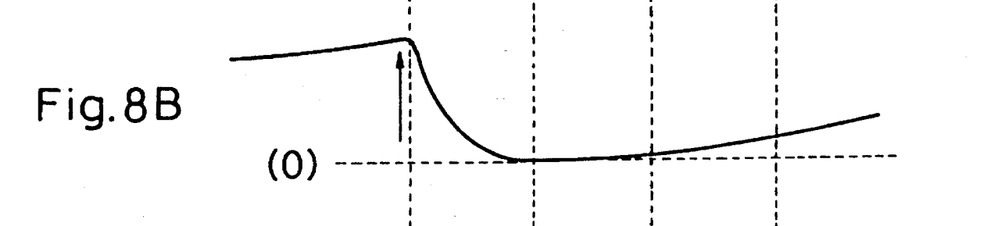
Figure 8C:
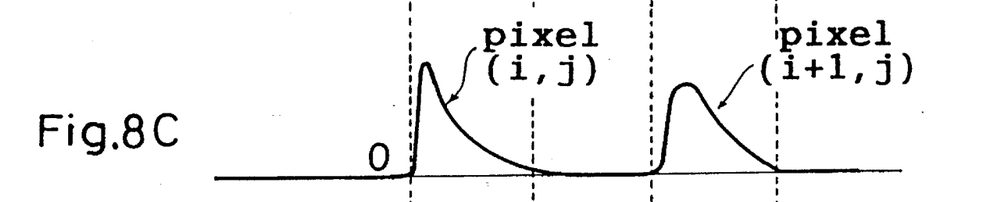
Figure 8D:
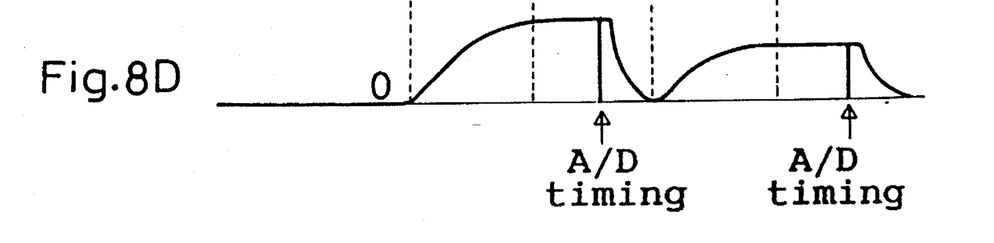

FIGS. 8A through 8D show a time chart where the matrix conductors 41 are arranged in a matrix of 1000×1000, and the scan switch layer 14 scans these matrix conductors 41 30 times per second to output image signals in 30 frames per second. FIG. 8A shows an electric potential based on the bias voltage of the control lines. The drive circuit 15 successively applies a high voltage to the control lines, row by row, and the FETs 45 in a selected row (e.g. row "i") are turned on. Take a pixel in row "i" and column "j" of the matrix conductors 41 for example, the potential of the photoconductive film 13 adjacent this pixel which is at high level due to a charge accumulation resulting from X ray incidence as shown in FIG. 8B, is lowered to the level of the bias voltage when the FETs 45 in row "i" are turned on (Note that FIG. 8 is plotted with reference to the bias voltage). On the other hand, a signal reading current for pixel (i, j) flows to the signal reading line connected to column "j" as shown in FIG. 8C. This signal current is stored in the integrating capacitor 63 of the charge sensitive preamplifier 62, and outputted as an integral voltage signal as shown in FIG. 8D. An analog-to-digital conversion is effected on this signal during a hold period before the integrating switch 64 is operated.

Figure 9A:
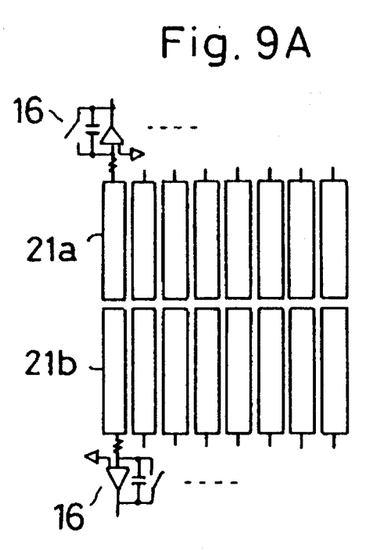
FIGS. 9A and 9B are schematic views of a modified two-dimensional radiation detector according to this invention.
Figure 9B:
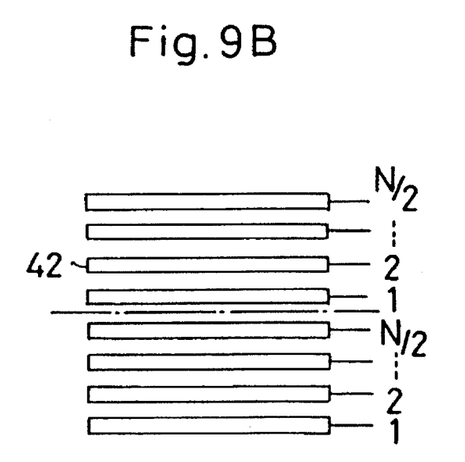

This invention may be embodied in modified forms as follows:

(1) In the foregoing embodiment, the column conductors 21 of the translucent electrode film 12 are formed in strip patterns covering all the matrix conductors 41 in the entire columnar direction thereof as shown in FIG. 4B. This arrangement may be modified, as shown in FIG. 9A, to include column conductors 21a and 21b arranged in vertically divided strip patterns. Each of the column conductors 21a and 21b is connected to a signal reading circuit 16. For reading signals, as shown in FIG. 9B, the row conductors 42 are divided into two groups corresponding to the vertically divided column conductors 21a and 21b, and the drive signal is applied simultaneously to two row conductors 42 having the same numeral in FIG. 9B. As a result, the FETs 45 arranged in the two rows are turned on simultaneously, whereby electric charges of the pixels in the two rows are read simultaneously through the column conductors 21a and 21b.

Figure 10A:
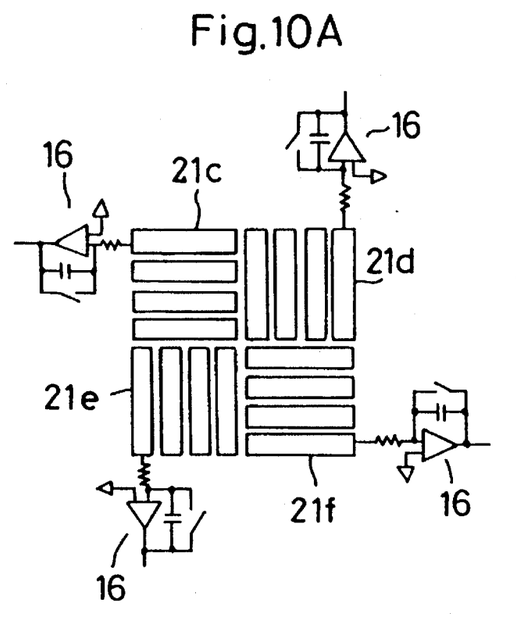
FIGS. 10A and 10B are schematic views of a further modified detector according to this invention.
Figure 10B:
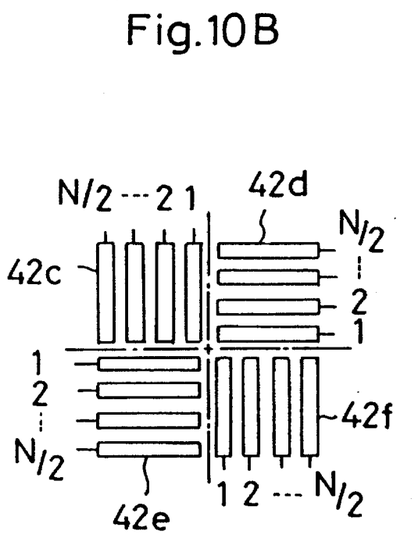

(2) As shown in FIG. 10A, the translucent electrode film 12 may include four groups of column conductors 21c–21f. The column conductors 21c and 21f extend horizontally while the column conductors 21d and 21e extend vertically. As shown in FIG. 10B, the row conductors 42 are also divided into four groups 42c–42f corresponding to the column conductors 21c–21f. The row conductors 42c–42f extend perpendicular to the corresponding column conductors 21c–21f, respectively. Each of the column conductors 21c–21f is connected to a signal reading circuit 16. For reading signals, the drive signal is applied simultaneously to four row conductors 42c–42f having the same numeral in FIG. 10B. As a result, the FETs 45 connected to the four row conductors 42c–42f are turned on simultaneously, whereby electric charges of the pixels corresponding to the four row conductors 42c–42f are read simultaneously through the column conductors 21c–21f.

According to the above modifications (1) and (2), the read signal lines (column conductors) have half the length of their counterparts in the preceding embodiment. Thus, the influences of noise are reduced accordingly.

Admittedly, the above modifications require twice as many signal reading circuits 16 as in the preceding embodiment. However, the number of times the row conductors are switched per frame time decreases since the charges stored in pixels corresponding to a plurality of row conductors are read simultaneously (i.e. the switching being done N times in the preceding embodiment, and N/2 times in the above modifications (1) and (2)). Hence, the frequency bandwidth per frame is halved to improve the signal-to-noise ratio (S/N ratio) accordingly.

The present invention may be embodied in other specific forms without departing from the spirit or essential attributes thereof and, accordingly, reference should be made to the appended claims, rather than to the foregoing specification, as indicating the scope of the invention.

What is claimed is:

1. A two-dimensional radiation detector for obtaining a radiographic image as converted into electric signals, said detector comprising:

a scintillator for converting said radiographic image into an optical image;

a photoconductive film for converting said optical image into an image based on electric charges;

a translucent electrode film and a scan switch layer formed on opposite surfaces of said photo-conductive film; and a drive circuit connected to said scan switch layer;

wherein said scan switch layer includes:

a plurality of conductors arranged in matrix form and in contact with said photoconductive film;

a conductor to which a bias voltage is applied;

a plurality of switching elements interposed between said conductors arranged in matrix form and said conductor to which said bias voltage is applied; and row conductors for applying a drive signal from said drive circuits to said switching elements;

said translucent electrode film including column conductors corresponding to columns of said conductors arranged in matrix form, each of said column conductors being connected to a signal reading line.

2. A two-dimensional radiation detector as defined in claim 1, wherein said scintillator comprises a needle crystal structure of sodium-doped cesium iodide (CsI:Na).

3. A two-dimensional radiation detector as defined in claim 1, wherein said photoconductive film comprises an amorphous semiconductor layer having selenium (Se) as a main component thereof.

4. A two-dimensional radiation detector as defined in claim 1, wherein said conductor to which said bias voltage is applied comprises a uniformly planar conductor covering said switching elements.

5. A two-dimensional radiation detector as defined in claim 1, wherein said switching elements comprise field-effect transistors (FETs), each FET having a drain electrode connected to one of said conductors arranged in matrix form, a source electrode connected along with source electrodes of the other FETs to said conductor to which said bias voltage is applied, and a gate electrode connected along with other FETs in the same row through one of said row conductors to said drive circuit.

6. A two-dimensional radiation detector as defined in claim 1, wherein said drive circuit includes a ground section for generating a drive signal of low voltage level to turn on said switching elements row by row, a floating section for converting said drive signal into a drive signal of bias voltage level, and an isolator section for electrically separating said ground section and said floating section.

7. A two-dimensional radiation detector as defined in claim 1, wherein each of said column conductors is connected to a signal reading circuit including a charge sensitive preamplifier and an integrating capacitor, to read simultaneously signals of pixels corresponding to one row of said conductors arranged in matrix form, said one row having said switching elements turned on by said drive circuit.

8. A two-dimensional radiation detector as defined in claim 1, wherein said column conductors are divided to correspond to a plurality of rows of said conductors arranged in matrix form.

9. A two-dimensional radiation detector as defined in claim 8, wherein said row conductors are divided and arranged to extend perpendicular to said column conductors, said drive signal being applied simultaneously to a plurality of corresponding row conductors among said row conductors divided.

* * * * *